United States Patent [19]
Carichner et al.

[11] Patent Number: 5,972,734
[45] Date of Patent: Oct. 26, 1999

[54] INTERPOSER FOR BALL GRID ARRAY (BGA) PACKAGE

[75] Inventors: Karla Y. Carichner, Pleasanton; Dexin Liang, Fremont, both of Calif.

[73] Assignee: LSI Logic Corporation, Milpitas, Calif.

[21] Appl. No.: 08/932,711

[22] Filed: Sep. 17, 1997

[51] Int. Cl.⁶ .......................... H01L 21/44; H01L 21/48; H01L 21/50
[52] U.S. Cl. .......................................... 438/106; 438/127
[58] Field of Search ..................... 438/106, 127

[56] References Cited

U.S. PATENT DOCUMENTS

| | | | |
|---|---|---|---|
| 4,630,172 | 12/1986 | Stenerson et al. | 361/386 |
| 4,827,082 | 5/1989 | Horiuchi et al. | 174/52.4 |
| 5,130,889 | 7/1992 | Hamburgen et al. | 361/388 |
| 5,291,062 | 3/1994 | Higgins, III | 257/698 |
| 5,294,750 | 3/1994 | Sakai et al. | 174/52.4 |
| 5,355,283 | 10/1994 | Marrs et al. | 361/760 |
| 5,403,782 | 4/1995 | Dixon et al. | 437/209 |
| 5,409,865 | 4/1995 | Karnezos | 437/210 |
| 5,420,460 | 5/1995 | Massingill | 257/693 |
| 5,444,296 | 8/1995 | Kaul et al. | 257/686 |
| 5,450,283 | 9/1995 | Lin et al. | 361/704 |
| 5,461,197 | 10/1995 | Hiruta et al. | 174/52.4 |
| 5,462,624 | 10/1995 | Kwon . | |
| 5,467,253 | 11/1995 | Heckman et al. | 361/761 |
| 5,483,102 | 1/1996 | Neal et al. | 257/712 |
| 5,498,903 | 3/1996 | Dixon et al. | 257/690 |
| 5,541,449 | 7/1996 | Crane et al. | 257/697 |
| 5,541,450 | 7/1996 | Jones et al. | 257/697 |

*Primary Examiner*—John F. Niebling
*Assistant Examiner*—Josetta Jones

[57] ABSTRACT

A ball grid array package (BGA) according to the present invention has an interposer between a bond pad on the lower surface of the substrate and the solder ball. The interposer has a conductive portion in contact with the bond pad surrounded by a nonconductive or insulating portion. The conductive portion in contact with the bond pad is sufficiently constrained from widening during a subsequent reflow process by the presence of the nonconductive or insulating portion. The contact with the bond pad is sufficiently small to allow traces to pass near the bond pad substantially directly en route to another bond pad. The nonconductive portion also prevents subsequently-applied encapsulant from coming in contact with and contaminating the bond pad. The elevated surface of the interposer, i.e. the surface of the interposer furthest from the bond pad, supports the solder ball, and is sufficiently wide to support the solder ball without allowing the solder ball to come in contact with the traces. The solder ball and the trace routing on the lower surface of the substrate is in different planes, thereby allowing a simplified trace routing, but retaining and even increasing rigidity of the structure and coplanarity of the solder balls.

20 Claims, 2 Drawing Sheets

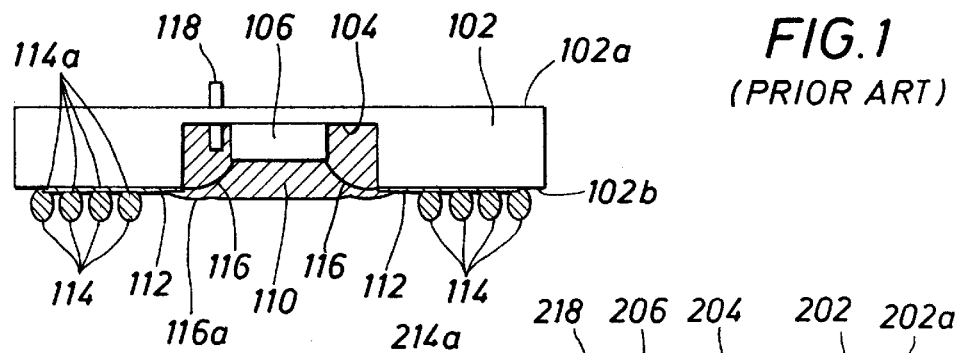
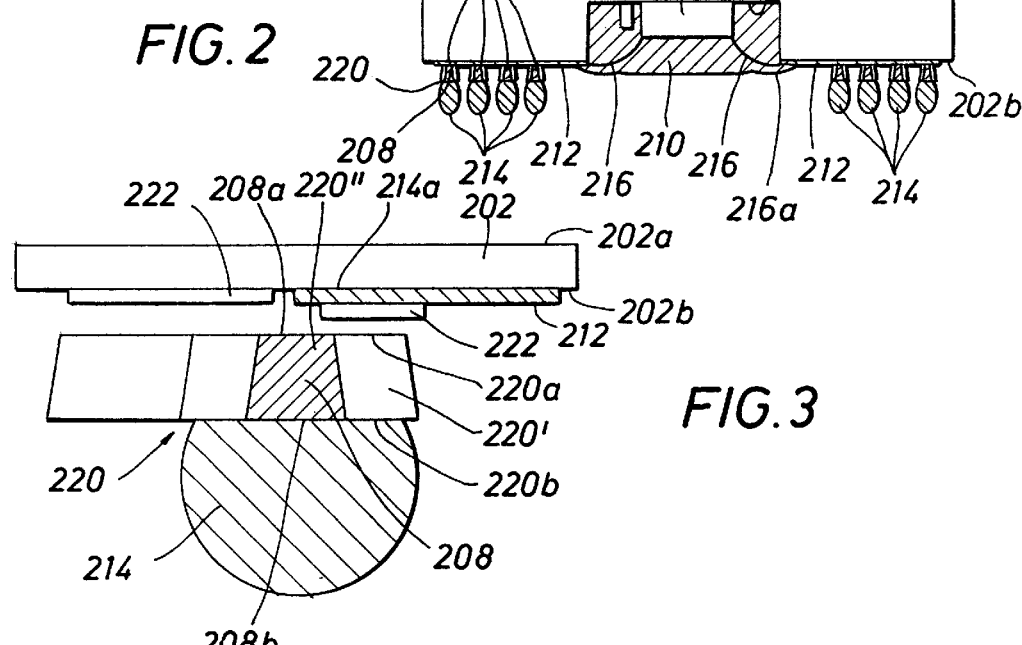
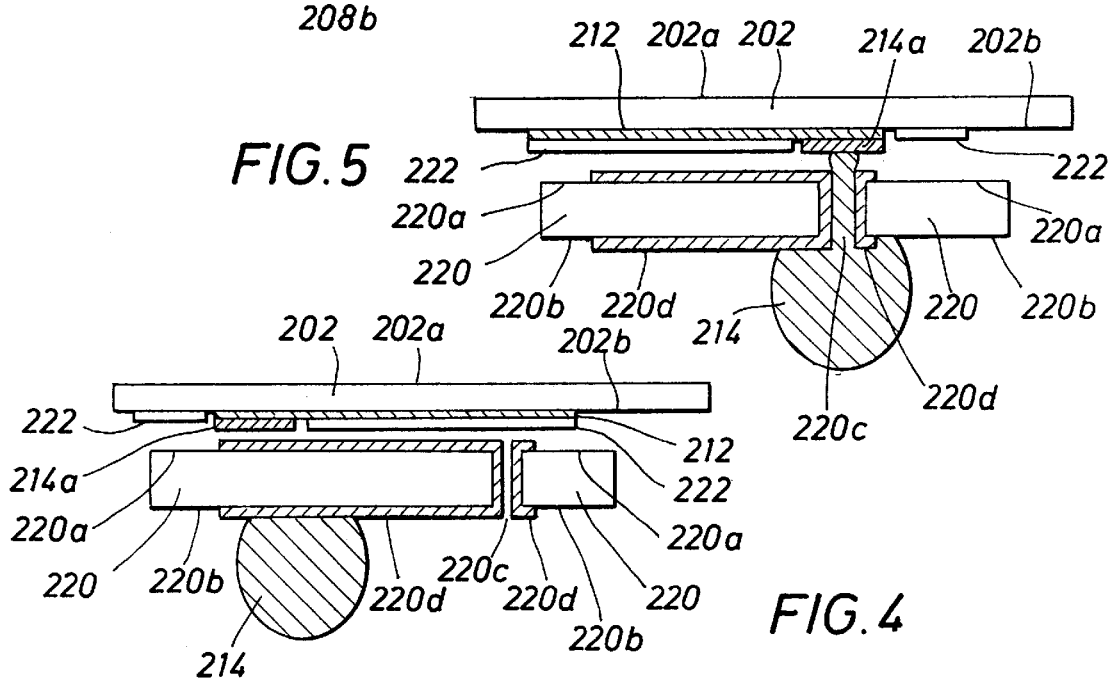

INTERPOSER FOR BALL GRID ARRAY (BGA) PACKAGE

BACKGROUND OF THE INVENTION

1. Field of the Invention

The present invention relates to an electronic semiconductor device, and more specifically to a ball grid array (BGA) package.

2. Description of the Related Art

Many electronic devices include integrated circuits mounted on printed circuit boards. Integrated circuits, or dies, have been typically packaged for ease of installation on the printed circuit board. Small packages provide a competitive advantage in consumer products by limiting the size of the printed circuit board to enhance the portability of the electronic devices.

Integrated circuits typically have leads, or bond wires, for connection to a printed circuit board. However, as integrated circuits have become more complex, the number of leads has increased. This increase in lead count, coupled with the reduction in package size, has lead to leads having a finer pitch. The finer lead pitch allows a small package size and the resulting high density board assembly. However, the fine pitch of the leads has made it difficult to assemble the board.

Ball grid array (BGA) packages allow small integrated circuits to be connected easily on the "mother" circuit board. The die is mounted on one surface of a substrate, and a number of electrically conductive traces or wires are patterned onto a surface of the substrate. More particularly, fine pitch traces radiate outward from the die, with each trace connected, at one end, to the lead from the die and, at the other end, to a bond pad to which a solder ball is electrically connected.

A circuit board typically has an insulating layer covering a layer of conductive interconnects. Ball grid array packages are typically mounted onto a circuit board by reflowing the solder balls into holes in the insulating layer to connect with the conductive interconnect layer of the printed circuit board. Solder balls typically widen slightly during connection to the printed circuit board, during thermal cycling of the die during testing, and/or during operation of the device. Therefore, the solder balls are initially spaced apart a minimum distance from one another, from the traces to which connection is to be prevented, and from the die, even for smaller packages.

Also, a thicker substrate having a recess or cavity in the upper surface in a "cavity up" BGA has been used where the die is mounted within the cavity, allowing a stiffer package without increasing overall profile height. This package stiffness enhances the coplanarity of the solder balls. To achieve greater stiffness, package designers have added stiffeners, additional substrates, and thicker substrates. "Cavity up" BGA have experienced uncompensated inductances due to both the bending of the traces through the vias and the bending of the traces around the solder balls on the lower surface, particularly at higher frequencies. In particular, the "cavity up" substrate has typically included traces on the upper surface, connected to the die, which passed through small through-holes or "vias" in the substrate to the lower surface of the substrate. The traces on the lower surface of the substrate extend from the vias to connect with the solder balls. Like the "up" BGA, because the solder balls have been distributed on the lower surface of the substrate, the routing of the traces on the lower surface of the substrate was not rectilinear, and often when routing the traces they were "bent" around some other solder balls en route to the desired solder ball.

The uncompensated inductances due to the bending of the traces through the vias was reduced in "cavity down" BGA, since a cavity on the lower surface of a substrate allowed a die to be mounted on the cavity ceiling, almost completely within the substrate. The leads of the integrated circuit or die formed bond wire loops connecting directly to the traces on the lower surface of the substrate, thereby eliminating both the upper traces and the vias through the substrate.

For example, referring to FIG. 1, a "cavity down" ball grid array (BGA) package includes a substrate 102, having an upper surface 102a and a lower surface 102b, and a recessed central cavity 104 in the lower surface 102b. The substrate 102 is made of FR4, a thin printed wiring board (PWB) material. A semiconductor die 106 is mounted to the ceiling or top of the cavity 104 by a heat-dissipating, epoxy adhesive. The lower surface 102b of the substrate 102 is covered with a patterned lead frame of copper, forming a lead frame of traces 112 that extend outwardly from the edge of the cavity 104 with each trace ending on a bond pad 114a metallurgically wetted to a solder ball 114. The traces 112 have been typically very fine patterns of metallic conductors, each trace providing electrical connection between one of the solder balls 114 and a corresponding bond wire 116 at the edge of the cavity 104. The solder balls 114 are grouped near the periphery of the lower surface 102b of the substrate 102, for protection from possible widening.

The bond wire 116 at the edge of the cavity 104 is connected by either inner lead bonding (either thermosonic or thermocompression) or wire-bonding to a lead on the die 106. Although not shown in FIG. 1, the substrate 102 may have several layers of traces 112 separated by dielectric layers, each trace 112 of each lead frame being separately connected to a bond wire 116. The bond wires 116 loop height therefore create a "bump" 116a on the lower surface 102b of the substrate 102. Even when only one lead frame of traces 112 is included, the bond wires 116 create a bump on the lower surface 102b of the substrate 102. If desired, a heat sink 118 schematically shown in FIG. 1, can be positioned to pass through the substrate 102 into the cavity 104, to remove heat generated by the die 106. "Cavity down" BGA are also desired due to their improved thermal performance. The lower surface of the die 106 adheres directly to the thermally conductive heat spreader. This facilitates the use of an additional heat sink 108, externally attached, as well.

While "cavity down" ball grid array packages have reduced the uncompensated inductances caused by bending of the traces 112 through the vias, they have not eliminated the significant uncompensated impedance created by the bending of the traces 112 around the solder balls 114 on the lower surface 102b. This problem of bending in the routing of traces has been exacerbated as pin count (and consequently solder ball count) has increased. As can now be seen, the solder balls 114 nearer to the cavity obstruct a direct, rectilinear path between the bond wires 116 and the solder balls 114 nearer to the periphery of the substrate 102.

Yet another problem with ball grid array routing is the tight dimensional tolerance for implementing the traces 112. As the number of solder balls 114 has increased, the distance between adjacent solder balls 114 has diminished, leaving very little space for the traces 112. As package size was reduced and pin count increased, proportionally more of the package surface area was covered with solder balls, and hence the trace routing became more difficult to implement between the solder balls.

Another problem with existing ball grid arrays involve the encapsulation of the lower surface 102b of the substrate 102.

Encapsulating the package in a resin, liquid, or other protective material dispensed within the cavity has provided some measure of physical, electrical and thermal protection of the package from other packages on the shared printed circuit board. Referring again to FIG. 1, once fabricated, the package is encapsulated giving rise to at least three problems. First, the encapsulant 110 can amass in the vicinity of the bond wires 116 on the lower surface of the substrate 102, that could create an uneven surface or bump 116a that reduces the coplanarity of the solder balls 114. Solder balls 114 closer to the bump 116a may be prevented from coming into contact with the circuit board by the presence of the bump, even though other solder balls 114 may make appropriate connection. Second, the mass of encapsulant 110 intrudes on the standoff of the package and may prevent the solder balls 114 from reaching the circuit board. The standoff of a package is the distance between the lower surface the package and the upper surface of the circuit board. Third, the spreading of encapsulant 110 is difficult to control, and encapsulant 110 may come into contact with the bond pads 114a, thereby contaminating the bond pads 114a.

It will be recognized by one skilled in the art that other ball grid array structures are known. Some have been "cavity up," some have been "cavity down," and some have multiple cavities on the same substrate. Additionally, some have more than one substrate. Many of these have particular advantages over the prior art described, but these variations of designs do not eliminate the basic problem in routing and the thickness of the encapsulant 110 and the consequent reduction in profile standoff during the solder reflow to bond the package to the external printed circuit board.

SUMMARY OF THE INVENTION

Briefly, the present invention allows greater encapsulation height, not limited by the solder ball standoff and bond wire loop height. The present invention also places the solder ball and the trace routing on the lower surface of the substrate in different planes, thereby allowing a simplified trace routing, but still retaining coplanarity of the solder balls.

In some embodiments, an interposer is placed on the lower surface of the substrate, covering portions of the traces adjacent to the bond pads. The interposer does not cover the integrated circuit, the bond wires from the integrated circuit to the traces on the lower surface of the substrate, or a significant portion of the traces. Therefore, the integrated circuit, the bond wires, and a large portion of the traces are available for encapsulation.

Before the interposer is placed on the package, small holes can be formed through the interposer. An exposed portion of the bond pad and the small holes through the interposer are filled with solder or any other electrically conductive material which is compatible with solder, providing continuous solder connection of the solder ball to the bond pad.

BRIEF DESCRIPTION OF THE DRAWINGS

A better understanding of the present invention can be obtained when the following detailed description of the preferred embodiment is considered in conjunction with the following drawings, in which:

FIG. 1 shows an encapsulated "cavity down" BGA package, according to the prior art.

FIG. 2 shows a "cavity down" BGA package, including an interposer, according to one embodiment of the present invention.

FIG. 3 is an enlarged detail view of the interposer, bond pad and solder ball connection of FIG. 2.

FIG. 4 shows a first pre-plated interposer, as a first alternative to the structure of FIG. 3, compatible with the BGA package of FIG. 2.

FIG. 5 shows a second pre-plated interposer, as a second alternative to the structure of FIG. 3, compatible with the ball grid array package of FIG. 2.

DETAILED DESCRIPTION OF THE PREFERRED EMBODIMENT

Figure 6:
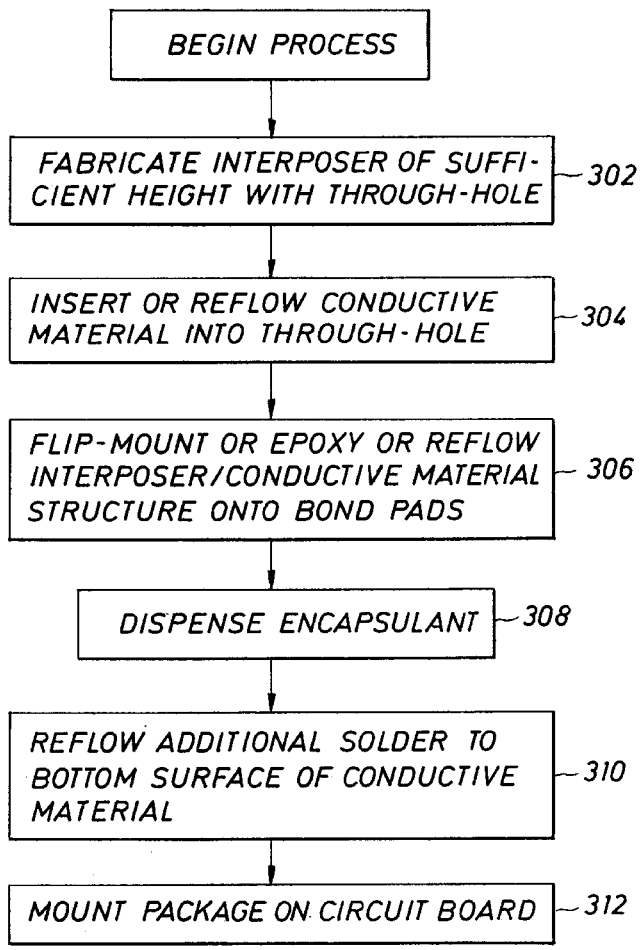
FIG. 6 shows a flow diagram for the present invention.

Referring to FIG. 2, a BGA package according to one embodiment of the present invention is shown. A substrate 202, having an upper surface 202a and a lower surface 202b, is fabricated having a central cavity 204 from the lower surface 202b of the substrate 202. The substrate 202 can be made of an electrically nonconductive material, either TAB tape (often made of high temperature, high strength, flexible dielectric material, such as polyamide film), or thin printed wiring board (PWB) material, such as FR4. Alternately, the substrate 202 may be replaced with a heat-sinking metallic or metallicized body. The substrate 202 may therefore have any of a wide range of physical properties including head dissipation and electrical shielding, and may be either flexible or rigid.

A die 206 is bonded to the ceiling or top of the cavity 204. In some embodiments, the die 206 is attached to the ceiling of the cavity 204 by an epoxy adhesive. On the lower surface 202bof the substrate 202, other than where the cavity 204 is located, electrically conductive traces 212 are positioned. One end of each of the traces 212 is connected by a bond wire 216 to the die 206. A heat sink 218 can be used to dissipate heat from the die 206. As best shown in FIGS. 3 to 5, the other end of each of the traces 212 is connected to a bond pad 214a. The bond pad 214a is generally smaller in area than the cross sectional area of a conventional solder ball 214. The traces 212 are formed of any conductive material, for example copper, copper-molybdenum-copper or copper-tungsten-copper laminates, beryllium-oxide, or aluminum-nitride metallicized with gold alloys or chromium, titanium, or nickel. In some embodiments, the traces 212 have a coefficient of thermal expansion substantially the same as that of the substrate 202 to reduce cracking and popping due to thermal stress, even on larger substrates.

In some embodiments of the present invention, an interposer 220 is fabricated and then mounted over a bond pad 214a. The interposer 220 includes a continuous nonconductive or insulating portion 220' (FIG. 3) formed around or adjacent to a conductive portion 220" (FIG. 3) fabricated from a conductive material 208. The nonconductive or insulating portion 220' of the interposer 220 may be fabricated by boring a hole through a small portion of nonconductive material, such as circuit board material, and then inserting or reflowing a conductive material 208 into the hole to form the conductive portion 220".

The conductive material 208 may be solder, copper, gold, or other material, and may be capable of being reflowed. The conductive portion 220" may be of any of a number of different shapes. For example, the conductive portion 220" may be "T-shaped" or frustroconical, with a smaller surface area on the upper surface 220a (FIG. 3) of the conductive portion 220" than on the lower surface 220b of the conductive portion 220". The conductive portion 220" may alternatively be cylindrical, extending from an upper surface 220a to the lower surface 220b (FIG. 3). The conductive material 208 may be mounted to the insulating portion 220' of the interposer 220, for example by an epoxy adhesive, or may be fused to the insulating portion 220' of the interposer 220 by the reflow process. The insulating portion 220' of the interposer 220 may be solenoidal, having a hole to allow the conductive material 208 to pass from one surface to the opposite surface, or may be shaped without a hole. If the insulating portion 220' of the interposer 220 is without a hole, the conductive material 208 is mounted on the side of the insulating portion 220' of the interposer 220. The conductive material 208 may have an additional bond pad (not shown) on the lower surface 220b, particularly if the surface area of the conductive material 208 at the lower surface 220b is small. A small amount of epoxy adhesive on the nonconductive portion of the lower surface 220b may be used to facilitate mounting of the lower bond pad (not shown).

Once the insulating portion 220' of the interposer 220 is fabricated, the insulating portion 220' of the interposer 220 is mounted to the lower surface 202b of the substrate 202, covering at least one of the bond pads 214a, so that the conductive material 208 can be electrically connected with one of the bond pads 214a. As best shown in FIGS. 2 and 3, the insulating portion 220' of the interposer 220 covers the bond pad 214a, and has provided a shield or barrier to the subsequent application of encapsulant 210. In some embodiments, the insulating portion 220' of the interposer 220 also protects the bond pad 214a from moisture.

In the package shown in FIG. 2, each of the bond pads 214a, and perhaps a small portion of each trace 212 connected to the bond pads 214a, is covered by an insulating portion 220' of the interposer 220. Very little of the remaining area of the lower surface 202b of the substrate 202 or the traces 212 are covered by the interposer 220. Since the solder balls 214 are not mounted directly onto the bond pads 214a, each trace 212 need only avoid the small bond pads 214a from which the trace 212 is to be electrically isolated as each trace 212 is routed from its bond pad 214a to its bond wire 216. In other words, there is no need for complex routing between solder balls. The interposer 220 also obviates the need for large clearance between adjacent solder balls and the traces so that the solder balls can expand or widen during reflow. Because of the small size of the bond pads 214a, the routing of the traces 212 from the bond wires 216 to the bond pads 214a is simplified. Moreover, because the traces may be straighter, the traces 212 are also shorter and provide less stray inductance.

The inserted conductive material 208 is a first portion and the solder ball 214 is a second portion of a conductive structure, providing a connection between an external surface of the solder ball 214 to the bond pad 214a by way of the inserted material 208. The solder ball 214 is elevated from the lower surface 202b of the substrate 202 by the interposer 220. If a lower bond pad (not shown) is included on the lower surface 220b of the interposer 220, the solder ball 214 may be mounted on the lower bond pad.

As best shown in FIG. 2, the lower surface 202b of the substrate 202 is further covered by a dispensed encapsulant 210, which then covers the lower surface 202b of the substrate 202. However, because the interposer 220 covers the bond pads 214a to provide a shield or barrier between the encapsulant 210 and bond pads 214a, the encapsulant 210 does not come into contact with the bond pads 214a. Moreover, because the interposer 220 has sufficient thickness so as to be thicker than the predetermined layer of encapsulant 210 itself, the lower surface 220b of the interposer 220 is not covered by the encapsulant 210. The encapsulant 210 may, however, cover the die 206 and fill the cavity 204, and cover the bond wires 216, and the traces 212.

In other embodiments (not shown), an insulating portion 220' of an interposer without a hole is mounted on the lower surface of the substrate over the bond pads, and then encapsulant is dispensed over the lower surface of the substrate. The insulating portion 220' of an interposer protects the bond pads from contact with the encapsulant. Once the encapsulant has cured, a small bore or through hole is drilled or formed through the insulating portion 220' of an interposer to expose a small portion of the bond pad. The small bore or through hole through the insulating portion 220' of an interposer, however, does not disturb or interfere with the traces. An electrically conductive material, which may also be thermally conductive, is then inserted into the small bore or through hole through the insulating portion 220' of an interposer. The material thus inserted is placed into electrical connection with the bond pads.

The inserted conductive material 208, in some embodiments, may be solder, or may be other metallic material. For example, the inserted conductive material 208 may be copper-molybdenum-copper or copper-tungsten-copper laminates, beryllium-oxide, or aluminum-nitride metallicized with gold alloys of chromium, titanium, or nickel. Any of these materials have coefficients of thermal expansion substantially close to that of silicon (and presumably of the silicon die 206) and therefore can be expected to reduce cracking and popping due to thermal stress, even on larger substrate areas. As shown in FIG. 2, solder resist 222, as discussed below, may be placed on the lower surface 202b of the substrate 202, adjacent to each end of the traces 212, to protect the traces 212 from coming into contact with the inserted conductive material 208 during a reflow process.

In some embodiments, the material for the nonconductive portion 220' of the interposer 220 is also selected to have a coefficient of thermal expansion substantially identical (or very similar) with that of the substrate 202, to diminish thermal stresses that might otherwise be created during thermal cycling of the die 206 during operation or during testing. In the preferred embodiment, the nonconductive portion 220' of the interposer 220 is electrically nonconductive. For example, the material for the nonconductive portion 220' of the interposer 220 may be printed wiring board (PWB) material, additional tape automated bonding (TAB) tape, epoxy resin, or other materials. The small hole from the solder ball 214 to the bond pad 214a penetrates only the electrically nonconductive portion 220' of the interposer 220 isolating the solder ball 214 from electrical connection with any of the other traces 212.

In the described embodiments, solder balls 214 are placed on the lower surface 220b of the interposer 220, in electrical connection with the inserted conductive material 208, and thereby in electrical connection with the bond pads 214a. Although described as solder balls, it will be understood that the solder balls 214 may be composed of virtually any electrically conductive material, including (but not limited to) gold, tin, lead, or an alloy of these metals, and of any configuration, such as square, rectangular, round, oblong, etc.

The inserted conductive material 208 may be connected to the solder ball 214 by a reflow process of the solder ball 214 or of the inserted conductive material 208 itself. Moreover, the inserted conductive material 208 may be held in place in contact with the corresponding trace 212 by a number of means known in the art, including reflow and/or mere structural rigidity of the encapsulant 210 and the interposer 220. Alternately, the inserted conductive material 208 may be simply formed of a single reflow of the solder ball 214.

It will be noted that, although described in terms of a single conductive material 208, the interposer 220 may be fabricated with several regions of conductive material 208 electrically isolated from one another. It should also be noted that the solder balls 214 may be mounted on the lower surface 220b of the interposer 220 before the interposer 220 is mounted on the substrate 202. Thus, according to one embodiment, solder balls 114 may be placed on their respective interposer 220, either before or after the interposer is mounted on the lower surface 202b of the substrate 202. In this embodiment, a plurality of interposers with solder balls are simultaneously aligned over their respective bond pads 214a.

It will be recognized that by using the present invention board routability is improved, as the traces 212 need only circumvent a much smaller bond pad 214a, and not a relatively larger solder ball 214. Also, encapsulation and wire-bound processes are more robust, since dimensional requirements are loosened. The encapsulation process is also simplified, since the insulating portion 220' of the interposer 220 provides its own barrier preventing the encapsulant 210 from coming in contact with either the bond pads 214a or the solder balls 214. Finally, depending on the stiffness of the various materials (the inserted conductive material 208 and the interposer 220, in particular), coplanarity of the overall package may be improved.

Referring now to FIG. 3, the solder ball 214, inserted conductive material 208, interposer 220, bond pads 214a, and one end of the trace 212, as well as the substrate 202, is shown enlarged and in greater detail. Electrically conductive traces 212 are bonded to the lower surface 202b of the substrate 202. As discussed above, the electrically conductive traces 212 may be composed of a very thin lead frame of patterned copper or other metal. The end of the trace 212 terminates in a bond pad 214a. The bond pad 214a may merely be the end of the trace 212, or may be a slightly larger thin conductive surface. The bond pad 214a may be integrally formed with the trace 212, or may be mounted on the lower surface 202b of the substrate 202 and connected to the trace 212. In some embodiments, the bond pads 214a are exposed through a small opening in a layer of solder resist 222 positioned adjacent the end of trace 212.

Also, as shown in FIG. 3, the nonconductive portion 220' of the interposer 220 has a small, frustroconical shaped bore hole therethrough to cover the end portion of the trace 212. The opening in the nonconductive portion 220' of the interposer 220 coincides with the bond pad 214a. An inserted conductive material 208, for example additional solder, penetrates the opening in the nonconductive portion 220' of the interposer 220 and comes into electrical contact with the bond pad 214a. The conductive material 208 has an upper surface 208a, which is in electrical contact with the bond pad 214a. In some embodiments, the conductive material 208 is solder and is reflowed to the bond pad 214a. Solder resist 222 may be placed on the lower surface 202b of the substrate 202, adjacent to each of the traces 212, to protect other traces 212 on the lower surface 202b of the substrate 202 from coming into contact with the inserted conductive material 208 during a reflow process. The solder resist 222 and the nonconductive portion 220' of the interposer 220 resists the inserted conductive material 208 from widening during the reflow process. The small surface area of both the bond pads 214a and the upper surface 208a of conductive material 208 is thereby preserved.

Figure 7:
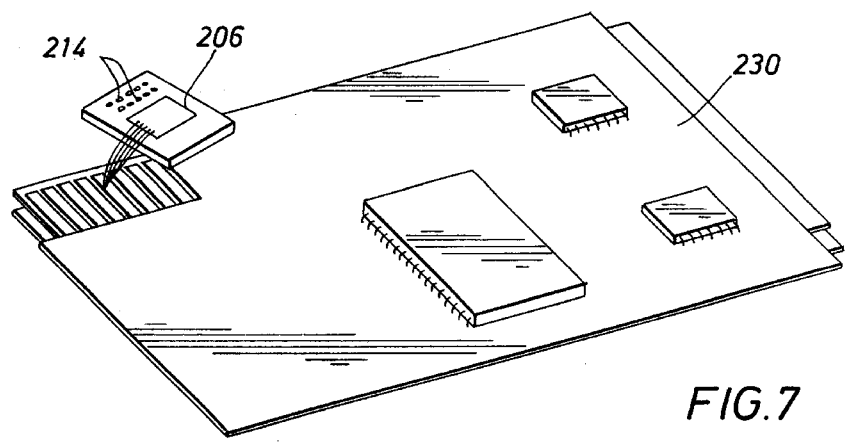
FIG. 7 shows a circuit board having a BGA package mounted thereon, according to one embodiment of the present invention.

A solder ball 214 is mounted on the lower surface 202b of the interposer 220, including the lower surface 208b of the inserted conductive material 208. The solder ball 214 may be made of any conductive material, including but not limited to solder, lead, tin, gold, or other metal or alloy of metals. The solder balls 214 may be replaced with pins for insertion into holes in a circuit board 230, such as shown in FIG. 7. The solder balls 214 are in electrical contact with the inserted material 208 at the lower surface 208b, but an intervening material such as a bond pad (not shown) may also be included, for example, if the conductive material 208 is cylindrical. In some embodiments, the lower surface 208b of the inserted conductive material 208 has a much greater surface area than either the upper surface 208a of the conductive material 280 or the bond pad 214a. The solder ball 214 of FIG. 3 may be of the same material as the inserted conductive material 208, or may be of a more thermally pliable material. The interposer 220 may be electrically insulating, or may have concentric rings, the inner ring in contact with the inserted material 208 being electrically insulative.

Referring now to FIG. 4, an interposer 220 has an upper surface 220a and a lower surface 220b. The upper surface 220a of the interposer 220 covers one of the bond pads 214a, and in some embodiments a portion of one of the traces 212, on the lower surface 202b of the substrate 202. However, an ultra-fine hole 220c through the interposer 220, similar to a via in a "cavity up" BGA package, exposes a small portion of the lower surface 202b of the substrate 202. Plating 220d connects the upper surface 220a of the interposer 220 to the lower surface 220b through the hole 220c. The plating 220d, when in contact with the pad 214a by an ancillary trace (not shown), thus allows electrical connection between the trace 212 via the bond pad 214a on the lower surface 202b of the substrate 202 to the lower surface 220b of the interposer 220. Therefore, the plating 220d allows a wide range of placement options for the solder balls 214 on the lower surface 220b of the interposer 220. The plating 220d may be fabricated according to a variety of plating processes known in the art. It should be noted that the lack of active devices on the lower surface 220b of the interposer 220 allows the fill surface area of the interposer 220 to be used for solder balls 214.

Referring now to FIG. 5, like the configuration of FIG. 4, an ultra-fine hole 220c is formed in the interposer 220. The ultrafine hole 220c is directly over a bond pad 214a connected to a trace 212 on the lower surface 202b of the substrate 202. As further shown in FIG. 5, a relatively large solder ball 214 is placed over the hole 220c in the interposer 220, and penetrates by a reflow process through the hole 220c to come into contact with the bond pad 214a. The hole 220c is plated with plating 220d, which directs the solder ball 214 during the reflow process to the bond pad 214a. As shown, solder resist 222 on the lower surface 202b of the substrate 202 may be used to control the flow of solder during the reflow process.

According to the embodiments of FIG. 4 and FIG. 5, an interposer 220 and solder ball 214 can be fabricated independently of the rest of the package. When the remainder of the package has been fabricated, the pre-plated interposer 220 can be aligned with the bond pads 214a terminating the traces 212 on the lower surface 202b of the substrate 202, and the interposer 220 soldered onto the rest of the package.

PROCESS FOR FABRICATING

Referring now to FIG. 6, a process for fabricating the above disclosed embodiment of the present invention is now described. To begin the process at step 302, the insulating portion 220' of an interposer 220 having a hole 220c therethrough is fabricated from an interposer material. The interposer material may be printed wiring board (PWB) material, such as FR4, or may be an organic epoxy glass resin, FR-2 board, lead frame type printed circuit board material, or other material having a thickness at least marginally greater than the profile loop height of the wires 216 connecting a typical "cavity down" BGA die 206 to the traces 212 on the lower surface 202b of the substrate 202. In one embodiment, the interposer 220 is at least 10 mils in height. The nonconductive portion 220' of the interposer 220 may be solenoidal or otherwise have a hole 220c (FIGS. 3, 4 and 5) passing therethrough, the hole 220c being of sufficient cross-sectional area to allow a solder or other conductive material 208 to reflow through the hole. In some embodiments, the nonconductive portion 220' of the interposer 220 will have a coefficient of thermal expansion approximately equivalent to that of a package body, i.e., a coefficient of thermal expansion of approximately 17.

According to step 304, solder or other electrically conductive material 208 is inserted or reflowed through the hole in the interposer 220. The electrically conductive material may be lead, tin, gold, or other metal or alloy of metals, or may be a ceramic conductor or other conductor.

According to step 306, the structure including the interposer 220 with the electrically conductive material 208 is placed adjacent to bond pads 214a on the lower surface 202b of a substrate 202, before solder balls 214 have been attached. The electrically conductive material 208 is placed into electrical contact with the bond pads 214a, either by reflowing the electrically conductive material to the bond pads 214a, or by epoxying the interposer 220 to the lower surface 202b of the substrate 202 at the appropriate location.

At step 308, encapsulant 210 is syringe-dispensed into the cavity 204 (FIG. 2) of the substrate 202, and onto the bond wires 216 connecting the die 206 to the traces 212 on the lower surface 202b of the substrate 202. Sufficient encapsulant 210 is dispensed to completely cover the die 206, fill the cavity 204, and cover the bond wires 216, and in some embodiments minimally cover the traces 212 on the lower surface 202b of the substrate 202, but the encapsulant 210 is resisted from coming in contact either with the bond pads 214a or the material 208 inserted or reflowed through the interposer 220 by the presence of the nonconductive portion 220' of the interposer 220. The encapsulant 210 is generally not permitted to extend more than about 10 mils below the lower surface 202b of the substrate 202, which is typically just enough to cover the bond wires 216. Moreover, the thickness of the encapsulant 210 is less than the profile height of the interposer 220, and therefore the interposer 220 provides a minimum standoff distance. At step 310, a solder ball 214 is deposited on the inserted material 208 and the interposer 220, by reflowing the solder ball 214.

In some embodiments, the package, now complete, is mounted onto a printed circuit board 230, as shown in FIG. 7. At step 312, the entire package is coupled to a printed circuit board 230, with the active surface (the lower surface 202b of the substrate 202) adjacent to the printed circuit board 230. Because of the presence of the interposer 220, the encapsulant 210 does not come in contact with the surface of the printed circuit board 230. However, the solder balls 214 are in contact with the surface of the printed circuit board 230. The solder balls 214 are then reflowed, typically by hot air injection or other means, and affixed to the interconnects within the printed circuit board 230.

The circuit board 230 is, in some embodiments, a motherboard of a computer system. In other embodiments, the circuit board 230 is a card for insertion into a socket in a motherboard or other board of a computer system. In still other embodiments, the circuit board 230 is included in an electronic appliance, such a television set, a microwave oven, an automobile, aircraft, a digital wrist watch, or anywhere else electronic circuitry is found.

Thus, an interposer 220 for the "cavity down" BGA package allows and insures that solder balls 214 on the lower surface 202b of a substrate 220 have sufficient standoff to come in contact with the surface of the printed circuit board 230, without being held away from the printed circuit board 230 by "bumps" 216a in the encapsulant 210 over bond wires 216, and can be connected to the interconnects of the printed circuit board 230 easily and efficiently.

The foregoing disclosure and description of the invention are illustrative and explanatory thereof, and various changes in the size, shape, methods, components, circuit elements, wiring, connections and contacts, as well as in the details of the illustrated circuitry and method of operation may be made without departing from the spirit of the invention.

What is claimed is:

1. A method for fabricating a ball grid array package, comprising the steps of:

selecting a substrate having an upper surface and a lower surface;

positioning a die on said substrate;

positioning at least one trace on one of the surfaces of the substrate;

coupling the die to said trace;

positioning an insulating portion of an interposer having a hole so that said hole of said insulating portion is in communication with a portion of said trace; and providing a first conductive material within the interposer hole for electrically connecting said first conductive material to said trace.

2. The method of claim 1, further comprising the steps of:

mounting additional conductive material on the interposer so that the additional conductive material is in contact with said first conductive material.

3. The method of claim 1, wherein the step of electrically connecting comprises the step of reflowing said first conductive material.

4. The method of claim 1, further comprising the steps of:

dispensing encapsulant on the lower surface of the substrate, the encapsulant covering said die.

5. The method of claim 4, wherein the step of dispensing also includes the step of:

dispensing encapsulant over at least a portion of a trace coupled to the die.

6. The method of claim 5, wherein:

the step of dispensing encapsulant on the lower surface of the substrate includes a step of dispensing encapsulant within the cavity to cover said die.

7. The method of claim 1, wherein:

the step of selecting a substrate having an upper surface and a lower surface includes a step of selecting a substrate having a thickness sufficient for forming a cavity; and the step of positioning a die includes the steps of:
providing a cavity within the lower surface; and
mounting the die within the cavity.

8. A method for fabricating a ball grid array package, comprising the steps of:

selecting a substrate;

positioning at least one trace on said substrate;

positioning a die on said substrate;

coupling the die to said trace;

positioning an insulating portion of an interposer on a portion of said trace; and providing a first conductive material on the interposer for electrically connecting said first conductive material to said trace.

9. The method of claim 8, wherein electrically connecting comprises the step of reflowing said first conductive material.

10. The method of claim 8, further comprising the step of:

adding conductive material on the interposer so that the additional conductive material is in contact with said first conductive material.

11. The method of claim 8, further comprising the step of:

dispensing encapsulant over at least a portion of a trace coupled to the die.

12. The method of claim 11, wherein:

the step of dispensing encapsulant includes a step of dispensing encapsulant within the cavity to cover said die.

13. The method of claim 8, wherein:

the step of selecting a substrate includes a step of selecting a substrate having a thickness sufficient for forming a cavity; and the step of positioning a die includes the steps of:
providing a cavity within the lower surface; and
mounting the die within the cavity.

14. A method for fabricating a ball grid array package, comprising the steps of:

selecting a substrate;

positioning at least one trace on said substrate;

positioning a die on said substrate;

coupling said die to said trace;

positioning an interposer having an insulating portion on said substrate on a portion of said trace;

dispensing encapsulant over a portion of said substrate;

forming a bore through said interposer to expose said trace; and providing a first conductive material in the interposer bore for electrically connecting said first conductive material to said trace.

15. The method of claim 14, further comprising the step of:

adding conductive material on the interposer so that the additional conductive material is in contact with said first conductive material.

16. The method of claim 14, wherein electrically connecting comprises the step of reflowing said first conductive material.

17. The method of claim 14, wherein the step of dispensing also includes the step of:

dispensing encapsulant over at least a portion of a trace coupled to the die.

18. The method of claim 17, wherein:

the step of dispensing encapsulant includes a step of dispensing encapsulant within the cavity to cover said die.

19. The method of claim 14, wherein:

the step of selecting a substrate includes a step of selecting a substrate having a thickness sufficient for forming a cavity; and the step of positioning a die includes the steps of:
providing a cavity within the lower surface; and
mounting the die within the cavity.

20. The method of claim 14 further comprising the step of:

curing the encapsulant before the step of forming a bore.

* * * * *